(12) United States Patent
Morikawa

(10) Patent No.: US 7,671,372 B2
(45) Date of Patent: Mar. 2, 2010

(54) DIGITAL SIGNAL TRANSFER DEVICE

(75) Inventor: Ryuichi Morikawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1186 days.

(21) Appl. No.: 11/215,126

(22) Filed: Aug. 31, 2005

(65) Prior Publication Data

US 2006/0043389 A1  Mar. 2, 2006

(30) Foreign Application Priority Data

Sep. 1, 2004  (JP)  ............................ P2004-254453

(51) Int. Cl.
*H01L 33/00* (2006.01)
(52) U.S. Cl. .......................... 257/81; 375/222; 375/257; 375/258
(58) Field of Classification Search .......... 375/257–258
See application file for complete search history.

(56) References Cited

U.S. PATENT DOCUMENTS

| | | | |
|---|---|---|---|
| 4,644,321 A * | 2/1987 | Kennon | ....................... 375/258 |
| 6,603,807 B1 | 8/2003 | Yukutake et al. | |
| 7,158,573 B2 * | 1/2007 | Hershbarger | ................. 375/258 |
| 7,277,491 B2 * | 10/2007 | Dong et al. | .................. 375/258 |
| 2004/0057511 A1 * | 3/2004 | Liu | ............................ 375/222 |

FOREIGN PATENT DOCUMENTS

CN  1258406 A  6/2000

OTHER PUBLICATIONS

Toshiba Ltd. Photocoupler/Photorelay Product Guide, Sep. 2001, pp. 185-192 and 198-200.

* cited by examiner

*Primary Examiner*—David C Payne
*Assistant Examiner*—Leon Flores
(74) *Attorney, Agent, or Firm*—Foley & Lardner LLP

(57) ABSTRACT

A digital signal transfer device generates from a modulating section (100) a modulated signal responsive to a digital input signal and transfers this to a demodulating section (200) through a pulse transformer (6). The demodulating section (200) generates from the modulated signal an output signal in which the digital input signal waveform is restored.

6 Claims, 8 Drawing Sheets

FIG. 2A Vc
FIG. 2B Vs
FIG. 2C Vp1
FIG. 2D Vp2
FIG. 2E Vgf
FIG. 2F Vd
FIG. 2G Vgi

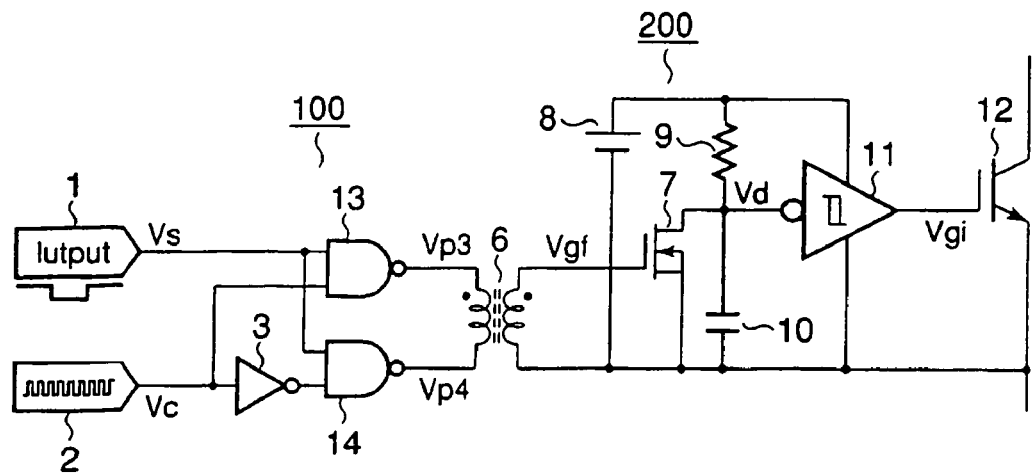
FIG. 3
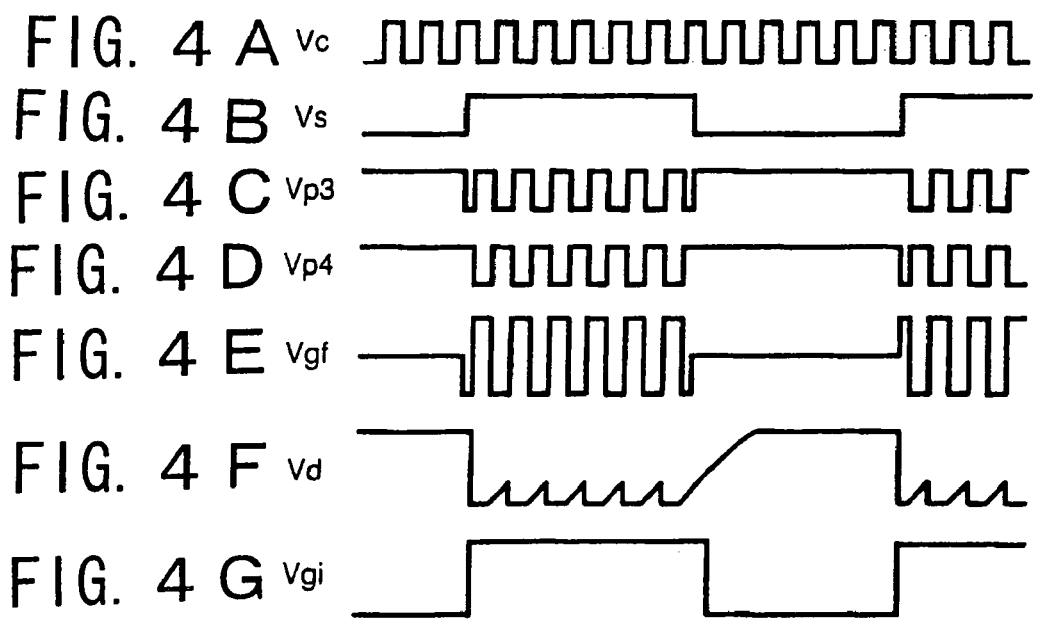

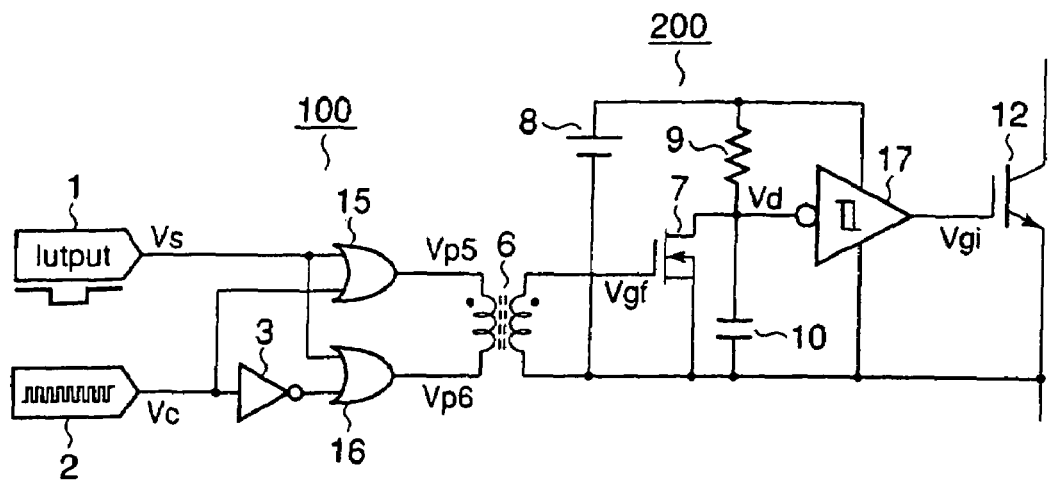
FIG. 5
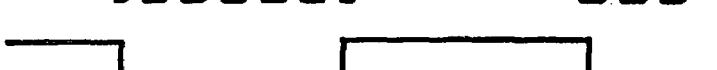

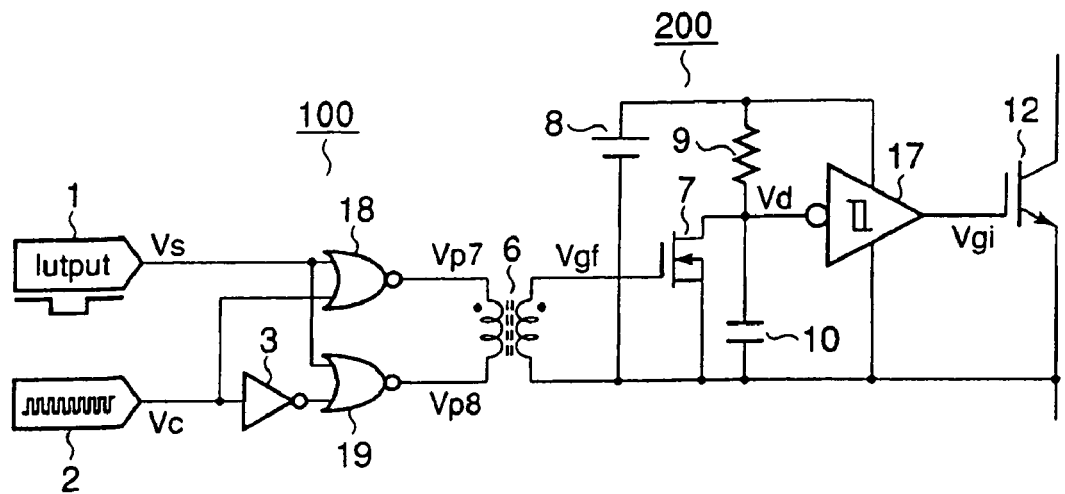
FIG. 7
FIG. 8 A  Vc  
FIG. 8 B  Vs  
FIG. 8 C  Vp7 
FIG. 8 D  Vp8 
FIG. 8 E  Vgf 
FIG. 8 F  Vd  
FIG. 8 G  Vgi 

FIG. 10A Vc
FIG. 10B Vs
FIG. 10C Vp9
FIG. 10D Vgf
FIG. 10E Vd
FIG. 10F Vgi

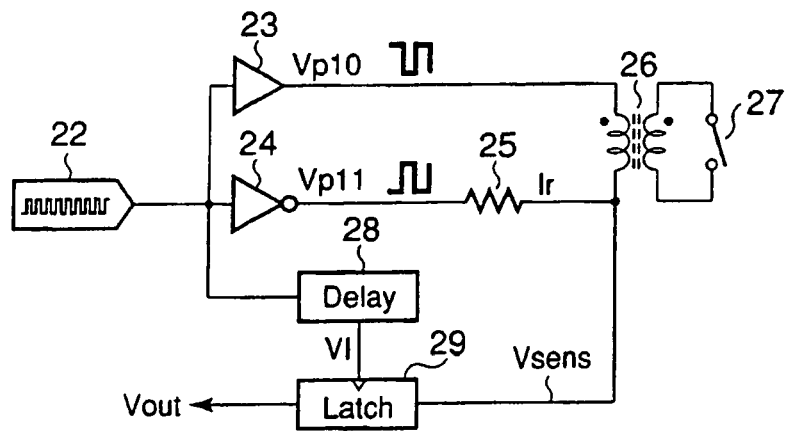
FIG. 11

FIG. 12B Vp10 
FIG. 12C Vp11 
FIG. 12D Ir 
FIG. 12E Vsens 
FIG. 12F Vl 
FIG. 12G Vout 

DIGITAL SIGNAL TRANSFER DEVICE

CROSS-REFERENCE TO RELATED APPLICATION

This application claims benefit of priority from Japanese Patent Application No. JP 2004-254453 filed Sep. 1, 2004, the entire content of which is incorporated by reference herein.

BACKGROUND OF THE INVENTION

1. Field of the Invention

The present invention relates to a digital signal transfer device that transfers a digital input signal by means of an isolating transfer system.

2. Description of the Related Art

Conventionally, digital signal transfer circuits that transfer a digital input signal from the input side to the output side in a condition in which the input side and output side are electrically isolated are employed in various types of circuit such as for example gate control circuits of inverters.

In such digital signal transfer circuits, a photocoupler is employed as means for achieving isolating transfer in which signal transfer is performed with the input side and output side electrically isolated. Examples are to be found in Toshiba Ltd Compact IPM application notes, Internet search <URL: http://www.semicon.Toshiba.co.jp/prd/tr/doc/db_bdjoo37a.h tml> and Toshiba Ltd photocoupler/photorelay product guide, Internet search <URL:http://www.semicon.Toshiba.co.jp/prd/opto/doc/catalog_143 62clap.html>.

In a digital signal transfer circuit in which a photocoupler is employed as isolating transfer means, when the circuit is employed for a long time, transfer of digital signals frequently becomes impossible due to deterioration of the photocoupler. Also, regarding the environment of use of the circuit, a photocoupler cannot be used in a high temperature environment of 100° C. or more for reasons to do with the photocoupler performance. Also, a photocoupler is unsuitable in particular for digital signal transfer circuits that perform high-speed signal transfer, because of signal delay of about a few hundred n sec (nano seconds) to a few μ sec (micro seconds) between input and output.

An object of the present invention is therefore to provide a novel digital signal transfer device of the isolating transfer type having superior performance wherein the problems of a photocoupler as isolating transfer means can be eliminated.

SUMMARY OF THE INVENTION

In order to achieve the above object, a digital signal transfer device according to the present invention is constructed as follows.

An aspect of the present invention is a digital signal transfer device wherein a modulated signal responsive to a digital input signal is transferred through an isolating transfer section (or unit) comprising for example a pulse transformer and this modulated signal is demodulated at the output side.

A digital signal transfer device according to an aspect of the present invention comprises:

a generating section that generates a square-wave carrier signal;

a modulating section that generates a modulated signal in which said carrier signal is changed in accordance with a digital input signal;

a demodulating section that generates an output signal in which the waveform of said digital input signal is restored, from this modulated signal; and an isolating transfer section whereby said modulating section and this demodulating section are connected in an electrically isolated condition and that transfers said modulated signal from said modulating section to said demodulating section.

By eliminating the problems of a photocoupler as an isolating transfer means, the present invention makes it possible to provide a digital signal transfer device of the isolating transfer type having excellent performance such as for example high reliability, high durability and high speed.

BRIEF DESCRIPTION OF THE DRAWINGS

A more complete appreciation of the present invention and many of the attendant advantages thereof will be readily-obtained as the same becomes better understood by reference to the following detailed description when considered in connection with the accompanying drawings, wherein:

FIG. 2A to FIG. 2G are timing charts given in explanation of the operation of a digital signal transfer circuit according to the first embodiment;

FIG. 3 is a view given in explanation of the layout of a digital signal transfer circuit according to a second embodiment;

FIG. 4A to FIG. 4G are timing charts given in explanation of the operation of a digital signal transfer circuit according to the second embodiment;

FIG. 5 is a view given in explanation of the layout of a digital signal transfer circuit according to a third embodiment;

FIG. 6A to FIG. 6G are timing charts given in explanation of the operation of a digital signal transfer circuit according to the third embodiment;

FIG. 7 is a view given in explanation of the layout of a digital signal transfer circuit according to a fourth embodiment;

FIG. 8A to FIG. 8G are timing charts given in explanation of the operation of a digital signal transfer circuit according to the fourth embodiment;

FIG. 10A to FIG. 10F are timing charts given in explanation of the operation of a digital signal transfer circuit according to the fifth embodiment;

FIG. 11 is a view given in explanation of the layout of a digital signal transfer circuit according to a sixth embodiment;

FIG. 12A to FIG. 12G are timing charts given in explanation of the operation of a digital signal transfer circuit according to the sixth embodiment;

DETAILED DESCRIPTION OF THE PREFERRED EMBODIMENTS

Figure 1:
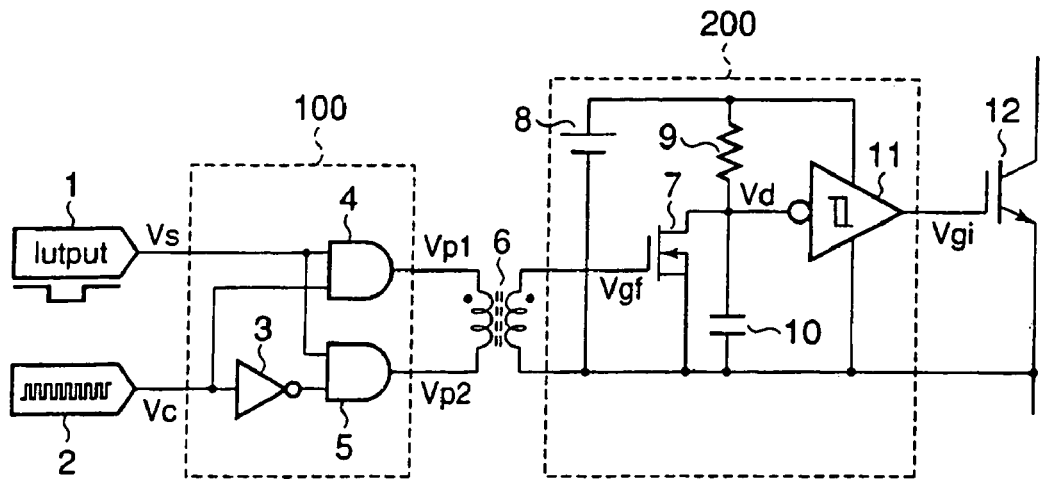
FIG. 1 is a view given in explanation of the layout of a digital signal transfer circuit according to a first embodiment of the present invention.

Referring now to the drawings, wherein like reference numerals designate identical or corresponding parts throughout the several views, and more particularly to FIG. 1 and FIG. 2A to FIG. 2G thereof, one embodiment of the present invention will be described.

First Embodiment

FIG. 1 is a view showing a detail of a gate drive circuit of for example an inverter employing a digital signal transfer circuit according to a first embodiment. FIG. 2A to FIG. 2G are timing charts given in explanation of the operation of this embodiment.

In general terms, this circuit comprises: a signal source 1 that outputs a digital signal (input signal wave) Vs, a carrier signal source 2 that generates a carrier signal Vc, a modulating section (input gate circuit) 100, a pulse transformer 6 constituting an isolating transfer section, and a demodulating section 200.

The signal source 1 outputs (see FIG. 2A) a digital signal (hereinbelow referred to as an on/off signal) Vs for drive control of an insulated gate transistor (hereinbelow referred to as an IGBT: insulated gate bipolar transistor) 12 constituting the driver of a gate drive circuit.

The carrier signal source 2 outputs (see FIG. 2B) a carrier signal Vc of a frequency that is sufficiently higher than that of the on/off signal Vs. By a "sufficiently higher frequency" is meant a frequency that is high enough that spurious operation (malfunction) of the inverting driver 11, to be described, in response to the carrier signal Vc does not take place: for example a frequency of the order of a few hundred kHz to a few MHz is suitable. However, if a high-speed inverting driver 11 is employed, an even higher frequency may be used. Also, the duty ratio of the carrier signal Vc is preferably of the order of 50% in order not to saturate the pulse transformer 6.

The modulating section 100 comprises an inverter 3, a first AND gate circuit (hereinbelow referred to as a first AND gate) 4 and second AND gate circuit (hereinbelow referred to as a second AND gate) 5. The inverter 3 is connected with the output terminal of the carrier signal source 2 and outputs an inverted signal of the carrier signal Vc that is output from the carrier signal source 2.

The first input terminal of the first AND gate 4 is connected with the output terminal of the signal source 1 and the second input terminal thereof is connected with the output terminal of the carrier signal source 2. The first AND gate 4 outputs (see FIG. 2C) an output signal Vp1 consisting of the carrier signal Vc modulated (gate controlled) by the on/off signal Vs.

Also the first input terminal of the second AND gate 5 is connected with the output terminal of the signal source 1 and the second input terminal thereof is connected with the output terminal of the inverter 3; thus the second AND gate 5 outputs (see FIG. 2D) an output signal Vp2 obtained by modulating (gate controlling) the inverted signal of the carrier signal Vc by the on/off signal Vs.

That is, in this embodiment, modulation means an AND logic calculation (AND gate control) action performed by the first and second AND gates 4, 5.

The pulse transformer 6 constitutes an isolating transfer section that provides isolating coupling of a primary side modulating section 100 and secondary side demodulating section 200 and thus effects isolating transfer of the modulated signals (Vp1, Vp2) from the modulating section 100 to the demodulating section 200.

The primary winding of the pulse transformer 6 is connected with the output terminals of the first and second AND gates 4, 5 and the secondary winding thereof is connected with the gate terminal and source terminal of a field effect transistor (hereinbelow abbreviated to FET) 7 contained in the demodulating section 200.

The demodulating section 200 demodulates (see FIG. 2G) the gate signal Vgi of the IGBT 12, corresponding to the on/off signal Vs from the modulating signal transferred from the modulating section 100. The demodulating section 200 comprises an FET 7, power source 8, resistance 9, capacitor 10 and inverting driver 11.

The FET 7 operates as a switching element that performs on/off switching under the control of the voltage induced in the secondary winding of the pulse transformer 6. The FET 7 controls charging/discharging of the capacitor 10 that is connected between the drain terminal and source terminal. Specifically, the charge that was charged on the capacitor 10 is discharged by turning the FET 7 on. Also, when the FET 7 is turned off, the capacitor 10 is charged from the power source 8 that is connected therewith through the resistance 9.

The input terminal of the inverting driver 11 is connected with the capacitor 10 and the output terminal thereof is connected with the gate terminal of the IGBT 12. When the voltage of the capacitor 10 is low-level, the inverting driver 11 applies a high-level gate signal Vgi to the gate terminal of the IGBT 12.

The operation of this embodiment with the above layout is described with reference to the timing charts of FIG. 1 and FIG. 2A to FIG. 2G.

As shown in FIG. 2A, FIG. 2B, and FIG. 2C, when a high frequency carrier signal Vc is output from the carrier signal source 2 and, in addition, an on/off signal Vs of high logic level is output from the signal source 1, the signal Vp1, which is the result of the AND calculation of these signals Vs and Vc, is output from the first AND gate 4. And as shown in FIG. 2D, the inverted signal Vp2 of the output signal Vp1 of the first AND gate 4 is output from the second AND gate 5.

When this output signal from the modulating section 100 is applied to the primary winding of the pulse transformer 6, as shown in FIG. 2E, a voltage Vgf of similar waveform to the carrier signal Vc is induced in the secondary winding of the pulse transformer 6. The FET 7 included in the demodulating section 200 is turned on or off by this voltage Vgf by alternate application of positive voltage and negative voltage thereto as the gate signal thereof.

When the voltage Vgf is positive, the FET 7 is turned on, so the charge that was charged on the capacitor 10 is discharged. When the voltage Vgf is negative, the FET 7 is turned off, so the capacitor 10 is charged by charge from the power source 8 through the resistance 9.

The rate of discharge of the capacitor 10 is determined by the capacitance of the capacitor 10 and the conduction resistance of the FET 7. Also, the rate of charging of the capacitor 10 is determined by the time constant of the capacitor 10 and the resistance 9. Usually, the resistance of the resistance 9 is set to be larger than the conduction resistance of the FET 7.

Also, when the FET 7 stays off, the voltage Vd of the capacitor 10 rises, but, every time the voltage Vgf that turns the FET 7 on is applied, with the period of the carrier signal Vc, the charge on the capacitor 10 is discharged. The input signal Vd of the inverting driver 11 is therefore unable to become high-level (see FIG. 2F). In other words, the time constant of the capacitor 10 and the resistance 9 must be set to be sufficiently long so that the FET 7 is not turned on/off in the period of the carrier signal Vc.

However, if this time constant is set to be too long, the lag of the gate signal Vgi of the IGBT 12 with respect to the on/off signal Vs becomes large, so the time constant or the period of the carrier signal Vc must be set so that this lag does not adversely affect operation of the IGBT 12.

When the charge on the capacitor 10 is discharged, causing the input signal Vd of the inverting driver 11 to become low level, the inverting driver 11 raises the gate voltage Vgi of the IGBT 12 to the vicinity of the voltage level of the power source 8, causing the IGBT 12 to be turned on (see FIG. 2G).

When an on/off signal Vs of low logic level is output from the signal source 1, the output signals Vp1, Vp2 of the first and second AND gates 4, 5 are both zero level. Consequently, the gate voltage Vgf of the FET 7 also becomes zero level, causing the FET 7 to turn off. Thereupon, if the FET 7 stays off, the voltage of the capacitor 10 rises, and when it exceeds the threshold value of the input level of the inverting driver 11, gate voltage Vgi for turning the IGBT 12 off is output from the inverting driver 11.

In this way, the inverting driver 11 included in the demodulating section 200 outputs gate voltage Vgi obtained by restoring (demodulating) the waveform of the input digital signal (on/off signal) Vs. Consequently, drive control of the IGBT 12 is effected in accordance with the input digital signal Vs as a result.

With this embodiment, without using a photocoupler, a gate signal transfer circuit of the digital transfer circuit constituted by the IGBT 12 can be realized by using an isolating transfer section comprising a pulse transformer 6. The pulse transformer 6 has superior operating characteristics at high temperature to a photocoupler and so makes it possible to implement a digital signal transfer circuit of high reliability.

Also, by adopting a high output frequency for the carrier signal source 2, the magnetic flux of the pulse transformer 6 can be reduced, so the pulse transformer 6 can be miniaturized and the transfer rate of the on/off signal Vs can be raised. Consequently, a digital signal transfer circuit can be implemented that is capable of high-speed transfer.

Modified Example

In addition, the same beneficial effect as in this embodiment can be achieved even if a buffer circuit for amplifying the voltage or current is connected to the output terminals of the first and second AND gates 4, 5.

Furthermore, it is also possible to perform circuit integration of the digital signal transfer circuit relating to this embodiment as a one-chip IC by forming some or all of the windings of the pulse transformer 6 and the primary circuits 2 to 5 and secondary circuits 7, 9, 10 and 11 on a silicon substrate, insulating the primary winding and second windings of the pulse transformer 6 by forming an insulating film of high voltage withstanding ability on the silicon substrate. In this way, a digital signal transfer circuit of small size and low cost can be implemented.

Second Embodiment

FIG. 3 and FIG. 4A to FIG. 4G are views given in explanation of a digital signal transfer circuit according to a second embodiment. The layout and beneficial effects of the digital signal transfer circuit according to the second embodiment will be described below with reference to FIG. 3 and FIG. 4A to FIG. 4G.

Layout and operation of this embodiment shown in FIG. 3 which are the same as in the case of the first embodiment shown in FIG. 1 are indicated by attaching the same reference symbols and detailed description is omitted.

The modulating section 100 of this embodiment comprises a first NAND circuit (hereinbelow called first NAND gate) 13 and second NAND circuit (hereinbelow called second NAND gate) 14.

The first input terminal of the first NAND gate 13 is connected with the output terminal of the signal source 1 and the second input terminal thereof is connected with the output terminal of the carrier signal source 2. The first NAND gate 13 outputs (see FIG. 4C) an output signal Vp3 consisting of the carrier signal Vc modulated (gate controlled) by the on/off signal Vs.

Also the first input terminal of the second NAND gate 14 is connected with the output terminal of the signal source 1 and the second input terminal thereof is connected with the output terminal of the inverter 3; thus the second NAND gate 14 outputs (see FIG. 4D) an output signal Vp4 obtained by modulating (gate controlling) the inverted signal of the carrier signal Vc by the on/off signal Vs.

That is, in this embodiment, modulation means a NAND logic calculation (NAND gate control) action performed by the first and second NAND gates 13, 14.

The primary winding of the pulse transformer 6 is respectively connected with the output terminals of the first and second NAND gates 13, 14.

As shown in FIG. 4A, FIG. 4B, and FIG. 4C, when the high frequency carrier signal Vc is output from the carrier signal source 2 and, in addition, a higher level on/off signal Vs is output from the signal source 1, the signal Vp3, which is the result of the NAND calculation performed on the signals Vs, Vc, is output from the first NAND gate 13. Furthermore, as shown in FIG. 4D, the inverted signal Vp4 of the output signal Vp3 of the first NAND gate 13 is output from the second NAND gate 14.

When the output signal from such a modulating section 100 is input to the primary winding of the pulse transformer 6, as shown in FIG. 4E, a voltage Vgf of waveform similar to the carrier signal Vc is induced in the secondary winding of the pulse transformer 6. By this voltage Vgf, positive voltage and negative voltage are alternately applied as gate signals to the FET 7 included in the demodulating section 200 and the FET 7 is thereby turned on or off.

When a low-level on/off signal Vs is output from the signal source 1, the output signals Vp3, Vp4 of the first and second NAND gate 13, 14 both assume the same voltage level. The gate voltage Vgf of the FET 7 then becomes zero level and the FET 7 is thereby turned off (see FIG. 4E).

That is, the gate voltage Vgf of the FET 7 of this embodiment is a waveform obtained by inverting the gate voltage Vgf of the first embodiment described above. The gate signal Vd of the inverting driver 11 is therefore a waveform that is offset by a maximum of half a period with respect to the carrier signal Vc, compared with the case of the first embodiment described above. However, if the frequency of the carrier signal Vc is sufficiently high in relation to the frequency of the on/off signal Vs, this offset does not pose a problem. The demodulating section 200 of this embodiment therefore outputs (see FIG. 4G) a gate voltage Vgi for subjecting the IGBT 12 to on/off control in accordance with the on/off signal (digital signal) Vs.

Thus, although these signals Vp3, Vp4 that are output from the modulating section 100 and the induced voltage Vgf in this embodiment are of waveforms that are inverted with respect to the case of the first embodiment, the result is that the same beneficial effect can be obtained as in the case of this first embodiment.

Modified Example

In addition, the same beneficial effect as in this embodiment can be achieved even if a buffer circuit for amplifying the voltage or current is connected to the output terminals of the first and second NAND gates 13, 14.

Third Embodiment

FIG. 5 and FIG. 6A to FIG. 6G are views given in explanation of a digital signal transfer circuit according to a third embodiment. The layout and beneficial effects of the digital signal transfer circuit according to the third embodiment will be described below with reference to FIG. 5 and FIG. 6A to FIG. 6G.

Layout and operation of this embodiment shown in FIG. 5 which is the same as in the case of the first embodiment shown in FIG. 1 are indicated by attaching the same reference symbols and detailed description is omitted.

The modulating section 100 of this embodiment comprises a first OR gate circuit (hereinbelow called first OR gate) 15 and second OR gate circuit (hereinbelow called second OR gate) 16. Also, the demodulating section 200 of this embodiment comprises a non-inverting driver 17 that outputs a gate signal Vgi of the IGBT 12.

The first input terminal of the first OR gate 15 is connected with the output terminal of the signal source 1 and the second input terminal thereof is connected with the output terminal of the carrier signal source 2. The first OR gate 15 outputs (see FIG. 6C) an output signal Vp5 consisting of the carrier signal Vc modulated (gate controlled) by the on/off signal Vs.

Also the first input terminal of the second OR gate 16 is connected with the output terminal of the signal source 1 and the second input terminal thereof is connected with the output terminal of the inverter 3; thus the second OR gate 16 outputs (see FIG. 6D) an output signal Vp6 obtained by modulating (gate controlling) the inverted signal of the carrier signal Vc by the on/off signal Vs.

That is, in this embodiment, modulation means OR logic calculation (OR gate control) action performed by the first and second OR gates 15, 16.

The primary winding of the pulse transformer 6 is respectively connected with the output terminals of the first and second OR gates 15, 16.

In the demodulating section 200, the input terminal of the non-inverting driver 17 is connected with the capacitor 10 and its output terminal is connected with the gate terminal of the IGBT 12. When the input voltage Vd of the non-inverting driver 17, corresponding to the voltage of the capacitor 10, is low level, the non-inverting driver 17 applies a low-level gate signal Vgi to the gate terminal of the IGBT 12. Also, when the input voltage Vd of the non-inverting driver 17 becomes high-level, the non-inverting driver 17 raises the gate voltage Vgi of the IGBT 12 to the vicinity of the voltage level of the power source 8, thereby turning the IGBT 12 on (see FIG. 6F and FIG. 6G).

As shown in FIG. 6C, FIG. 6D and FIG. 6E, when output signals Vp5, Vp6 from the modulating section 100 are applied to the primary winding of the pulse transformer 6 in accordance with the on/off signal Vs from the signal source 1 and the carrier signal Vc from the carrier signal source 2, a voltage Vgf that is of similar waveform to the carrier signal Vc is induced in the secondary winding of the pulse transformer 6.

By means of this voltage Vgf, positive voltage and negative voltage are alternately applied as gate signal to the FET 7 included in the demodulating section 200, causing it to turn on or off. When the output signals Vp5, Vp6 from the modulating section 100 both have the same voltage level, the gate voltage Vgf of the FET 7 becomes zero level and the FET 7 is thus turned off (see FIG. 6E).

When the on/off signal Vs is high-level, the input voltage Vd of the non-inverting driver 17 becomes high-level, and Vs is in the same phase with Vd. Consequently, although a slight lag with respect to the on/off signal Vs is generated, the non-inverting driver 17 outputs a gate voltage Vgi (see FIG. 6G) of a similar waveform to this signal Vs. The IGBT 12 is thereby subjected to on/off control in accordance with the on/off signal (digital signal) Vs.

Modified Example

The same beneficial effect as in the case of the first embodiment can thus be obtained with this embodiment also. In addition, the same beneficial effect as in this embodiment can be achieved even if a buffer circuit for amplifying the voltage or current is connected to the output terminals of the first and second OR gates 15, 16.

Fourth Embodiment

FIG. 7 and FIG. 8A to FIG. 8G are views given in explanation of a digital signal transfer circuit according to a fourth embodiment. The layout and beneficial effects of the digital signal transfer circuit according to the fourth embodiment will be described below with reference to FIG. 7 and FIG. 8A to FIG. 8G.

Layout and operation of this embodiment shown in FIG. 7 which is the same as in the case of the first embodiment shown in FIG. 1 and the third embodiment shown in FIG. 5 are indicated by attaching the same reference symbols and detailed description is omitted.

The modulating section 100 of this embodiment comprises a first NOR gate circuit (hereinbelow called first NOR gate) 18 and second NOR gate circuit (hereinbelow called second NOR gate) 19. The first input terminal of the first NOR gate 18 is connected with the output terminal of the signal source 1 and the second input terminal thereof is connected with the output terminal of the carrier signal source 2. The first NOR gate 18 outputs (see FIG. 8C) an output signal Vp7 consisting of the carrier signal Vc modulated (gate controlled) by the on/off signal Vs.

Also the first input terminal of the second NOR gate 19 is connected with the output terminal of the signal source 1 and the second input terminal thereof is connected with the output terminal of the inverter 3. Thus the second NOR gate 19 outputs (see FIG. 8D) an output signal Vp8 obtained by modulating (gate controlling) the inverted signal of the carrier signal Vc by the on/off signal Vs.

That is, in this embodiment, modulation means NOR logic calculation (NOR gate control) action performed by the first and second NOR gates 18, 19.

The primary winding of the pulse transformer 6 is connected with the output terminals of the first and second NOR gates 18, 19.

In this embodiment, as shown in FIG. 8, the signals Vp7, Vp8 that are output from the modulated section 100 and the induced voltage Vgf are of waveforms that are inverted with respect to the waveforms of the third embodiment described above, but the same beneficial effects as in this third embodiment can be obtained as a result.

Modified Example

In addition, the same beneficial effect as in this embodiment can be achieved even if a buffer circuit for amplifying the voltage or current is connected to the output terminals of the first and second NOR gates 18, 19.

Fifth Embodiment

FIG. 9 and FIG. 10A to FIG. 10F are views given in explanation of a digital signal transfer circuit according to a fifth embodiment. The layout and beneficial effects of the digital signal transfer circuit according to the fifth embodiment will be described below with reference to FIG. 9 and FIG. 10A to FIG. 10F.

Figure 9:
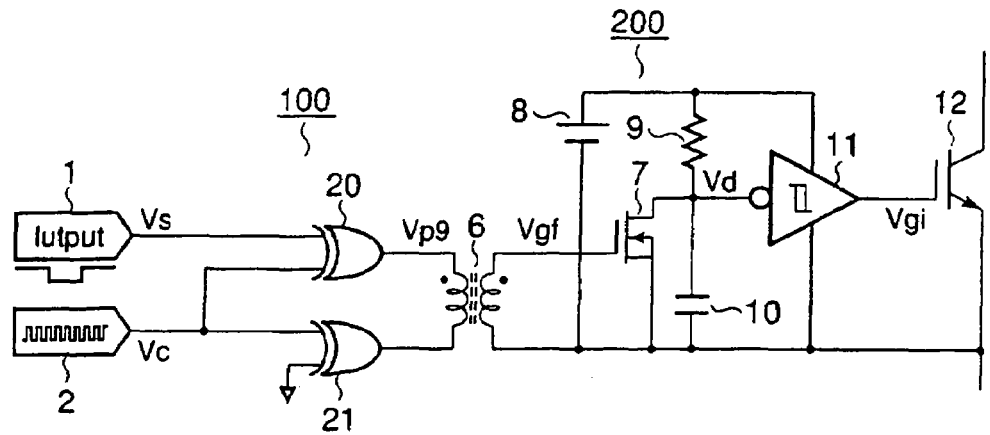
FIG. 9 is a view given in explanation of the layout of a digital signal transfer circuit according to a fifth embodiment.

Layout and operation of this embodiment shown in FIG. 9 which is the same as in the case of the first embodiment shown in FIG. 1 are indicated by attaching the same reference symbols and detailed description is omitted.

The modulating section 100 of this embodiment comprises a first exclusive OR gate circuit (hereinbelow called first EXOR gate) 20 and buffer circuit 21.

The first input terminal of the EXOR gate 20 is connected with the output terminal of the signal source 1 and the second input terminal thereof is connected with the output terminal of the carrier signal source 2. The EXOR gate 20 outputs (see FIG. 10C) an output signal Vp9 consisting of the carrier signal Vc modulated (gate controlled) by the on/off signal Vs.

That is, in this embodiment, modulation means EXOR logic calculation (EXOR gate control) action performed by the EXOR gate 20.

The first input terminal of the buffer circuit 21 is connected with the output terminal of the carrier signal source 2 and the second input terminal thereof is earthed and connected with the output terminal of the inverter 3. The buffer circuit 21 outputs a voltage of the same amplitude as the output of the EXOR gate 20 and of a waveform similar to that of the carrier signal Vc.

Since the EXOR gate 20 requires computation time (calculation time), the response reaction of the output signal lags the input signal by a few n sec. The buffer circuit 21 has the object of providing a delay equivalent to this and is effective for supplying to the pulse transformer 6 a waveform that is similar (of equal time ratio) to that of the carrier signal Vc. However, if the computation time of the EXOR gate 20 is sufficiently short in relation to the frequency of the carrier signal Vc or if the pulse transformer 6 is not saturated even when the time ratio of the carrier signal Vc and the time ratio of the voltage applied to the pulse transformer 6 are different, a buffer circuit 21 may not necessarily be essential.

As described above, with this embodiment also, the same beneficial effect as in the case of the first embodiment can be obtained. Also, compared with the first to the fourth embodiments, the inverter 3 can be dispensed with, so simplification of the circuit layout can be achieved. Furthermore, for the reasons described above, the buffer circuit 21 can also be dispensed with, making possible further simplification.

Sixth Embodiment

FIG. 11 and FIG. 12A to FIG. 12G are views given in explanation of a digital signal transfer circuit according to a sixth embodiment. The layout and beneficial effects of the digital signal transfer circuit according to the sixth embodiment will be described below with reference to FIG. 11 and FIG. 12A to FIG. 12G.

A digital signal transfer circuit according to this embodiment comprises a high frequency signal source 22, a buffer circuit 23, an inverter 24, a pulse transformer 26, an input switch circuit 27, a delay circuit 28 and a latch circuit 29.

The high-frequency signal source 22 outputs a square wave signal of a frequency that is sufficiently high that the pulse transformer 26 is not saturated. The buffer circuit 23 is connected with the output terminal of the high frequency signal source 22 and outputs (see FIG. 12B) a signal Vp10 of a waveform that is similar to the square wave signal that is output from this high frequency signal source 22.

The inverter 24 is connected with the output terminal of the high frequency signal source 22 and outputs (see FIG. 12C) a signal Vp11, which is a signal obtained by inverting (i.e. that differs in phase by 180°) the square wave signal that is output from this high frequency signal source 22. The output signal Vp10 of the buffer circuit 23 and the output signal Vp11 of the inverter 24 are therefore mutually inverted signals. The buffer circuit 23 and inverter 24 are the structural elements that supply the voltage and current required for driving the pulse transformer 26.

The output terminal of the inverter 24 is connected through the resistance 25 with one end of the primary winding of the pulse transformer 26 and the output terminal of the buffer circuit 23 is connected with the other end of this primary winding. A switch circuit 27 is connected with the secondary winding of the pulse transformer 26. Short-circuiting and opening of the secondary winding of the pulse transformer 26 are controlled by on/off operation (corresponding to high and low logic levels) of the switch circuit 27.

A delay circuit 28 is connected with the output terminal of the high frequency signal source 22 and outputs a latch signal VI (see FIG. 12F) delayed by a lag time Td from the square wave signal that is output from the high-frequency signal source 22.

The latch circuit 29 is connected with the resistance 25 and outputs a signal Vout (see FIG. 12G) that is the result of latching the voltage signal Vsens generated at one terminal of the resistance 25 with the rise timing of the latch signal VI that is output from the delay circuit 28. In other words, the latch circuit 29 corresponds to a demodulating circuit that restores the digital input corresponding to the on/off action of the switching circuit 27.

Next, the operation of this embodiment will be described.

Figure 12A:

As shown in FIG. 12A, in regard to the switching circuit 27, high-level means a closed condition and low-level means an open condition, corresponding to the on/off signal Vs referred to above. Specifically, when the switch circuit 27 is in closed condition, the secondary winding of the pulse transformer 26 is short-circuited. In this way, the voltage across the primary winding of the pulse transformer 26 can be regarded as zero, by making the resistance of the resistance 25 sufficiently larger than the winding impedance of this pulse transformer 26.

The input signal Vsens of the match circuit 29 therefore becomes equal to the output signal (voltage) Vp10 (see FIG. 12E) of the buffer circuit 23. The latch circuit 29 latches the input signal Vsens with the rise timing of the latch signal VI, which has a lag time Td, and outputs an output voltage Vout (see FIG. 12G).

The output voltage Vout depends on the lag time Td, but, if this lag time Td is shorter than the half period of the square wave signal that is output by the high-frequency signal source 22, is high-level. Also, if this lag time Td is longer than the half period but is shorter than one period, the output voltage Vout is low level. In this embodiment, this lag time Td is set to be shorter than the half period of the square wave signal that is output by the high-frequency signal source 22 and, as shown in FIG. 12A and FIG. 12G, if the switch 27 is in closed condition, the output signal Vout of the latch circuit 29 is high-level.

If the switch 27 is in open condition, the secondary winding of the pulse transformer 26 is open. The current Ir flowing in the resistance 25 is then of a sawtooth waveform (see FIG. 12D), resulting from the application of the square wave voltage "Vp10-Vp11" to the resistance 25 and exciting impedance of the pulse transformer 26.

The voltage obtained by adding the output voltage Vp11 of the inverter 24 to the amount of the voltage drop of the resistance R25 produced by this current Ir flowing therein constitutes the input voltage Vsens of the latch circuit 29. This input voltage Vsens is higher when Vp10 is low level than it is when Vp10 is high-level, reversing the situation from that which obtains when the switch circuit 27 is in closed condition. Consequently, as shown in FIG. 12A and FIG. 12G, when the switch circuit 27 is in open condition, the output signal Vout of the latch circuit 29 is low level.

Thus, as shown in FIG. 12E, if the switch circuit 27 is in an open condition, the input signal Vsens of the latch circuit 29 has a sensitive form. In this case, if the exciting impedance of the pulse transformer 26 is made large, the form of this input signal approaches the waveform of the output signal Vp11 of the inverter 24. Specifically, the voltage waveform of the input signal Vsens of the latch circuit 29 presents inverted waveforms when the switch circuit 27 is in the closed condition and when it is in the open condition.

Thus, essentially, with this embodiment, by using the pulse transformer 26, what may be termed a switch opening/closing monitoring circuit can be constituted, in which the open/closed condition of the switch circuit 27 is acquired as a voltage signal in an isolated condition of the switch circuit 27. In other words, by using a pulse transformer 26, whose operating characteristics in a high temperature environment are superior to those of a photocoupler, a digital signal transfer circuit can be realized that is of high reliability and whereby digital signals can be transmitted responsive to the opening/closing of a switch circuit 27.

In particular, with the construction of this embodiment, the circuit as a whole can be simplified, since circuitry apart from the switching circuit 27 can be concentrated on the primary side of the pulse transformer 26, without requiring a power source at the side of the switch circuit 27.

Also, by making the output frequency of the high-frequency signal source 22 high, the magnetic flux of the pulse transformer 26 can be reduced, so the pulse transformer 26 can be miniaturized and the transfer speed of the open/closed condition of the switch circuit 27 can be increased.

Seventh Embodiment

Figure 13:
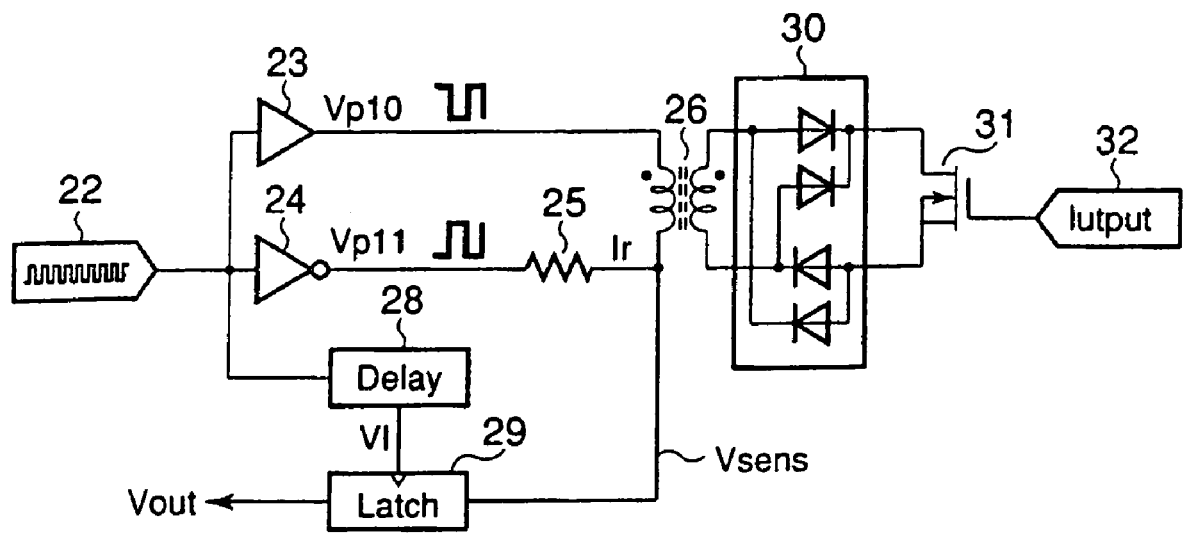
FIG. 13 is a view given in explanation of the layout of a digital signal transfer circuit according to a seventh embodiment.

FIG. 13 is a view given in explanation of a digital signal transfer circuit according to a seventh embodiment. The layout and beneficial effect of a digital signal transfer circuit according to this seventh embodiment are described below with reference to FIG. 13.

Layout and operation which are the same in this embodiment shown in FIG. 13 as in the case of the sixth embodiment shown FIG. 11 are indicated by attaching the same reference symbols and detailed description thereof is omitted.

In this embodiment, as shown in FIG. 13, the secondary winding of the pulse transformer 26c is connected with the AC terminal of a rectifier 30. The DC terminal of the rectifier 30 is connected with the drain terminal and source terminal of an FET 31.

An input signal source 32 generates a two-value i.e. high level and low-level digital signal. The gate terminal of the FET 31 is connected with the output terminal of the input signal source 32 and the FET 31 is thus turned on or off in accordance with the digital signal generated from the input signal source 32.

Next, the operation of this embodiment will be described.

When the digital signal that is output from the input signal source 32 becomes high-level, the FET 31 is put in on condition. In response to this, the secondary winding of the pulse transformer 26 assumes a short-circuited condition through the rectifier 30. Consequently, as described with reference to the sixth embodiment above, when the secondary winding of the pulse transformer 26 is short-circuited, the output signal Vout of the latch circuit 29 becomes high-level (see the closed condition of FIG. 12A and FIG. 12G).

Also, when the digital signal that is output from the input signal source 32 becomes low-level, the FET 31 is put in off condition. In response to this, the secondary winding of the pulse transformer 26 assumes an open condition. Consequently, the output signal Vout of the latch circuit 29 becomes low-level (see the open condition of FIG. 12A and FIG. 12G).

Thus, essentially, with this embodiment, the output signal Vout of the latch circuit 29 changes in response to the logic level of the digital signal that is output from the input signal source 32; as a result, isolating transfer of the digital signal can be achieved.

The case may be envisioned in which the voltage drop generated in the rectifier 30 when the FET 31 is on is so large that it cannot be neglected in comparison with the amplitude of the voltage induced in the secondary winding of the pulse transformer 26 when the FET 31 is off. In this case, the difference between the situations when the FET 31 is on and when the FET 31 is off, generated by the input voltage Vsens of the latch circuit 29, is small, so the probability of spurious operation being produced by for example noise increases.

However, such spurious operation as described above can be prevented by for example setting a high value of the output voltage specification of the buffer circuit 23 and inverter 24 or setting a high value of the ratio of the number of turns of the secondary wiring of the pulse transformer 26, so that the voltage drop generated in the rectifier 30 when the FET 31 is on is sufficiently small in comparison with the amplitude of the voltage induced in the secondary winding of the pulse transformer 26 when the FET 31 is off.

As described above, with this embodiment, in the same way as in the case of the sixth embodiment described above, by using a pulse transformer 26, whose operating characteristics in a high temperature environment are superior to those of a photocoupler, a digital signal transfer circuit can be realized that is of high reliability.

Also, this circuit can be integrated as a one-chip IC by forming the windings of the pulse transformer 26 and some or all of the circuits 22 to 31 of the primary and secondary side thereof on silicon, insulation between the primary winding and secondary winding of the pulse transformer 26 being provided by forming an insulating film of high voltage withstanding ability on the silicon: a digital signal transfer circuit of small size and low cost can therefore be implemented.

Eighth Embodiment

Figure 14:
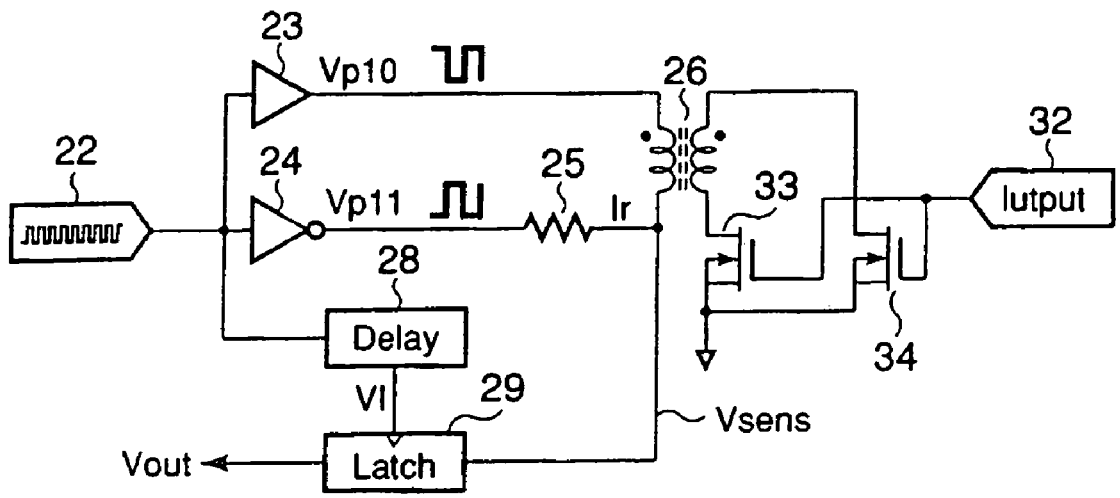
FIG. 14 is a view given in explanation of the layout of a digital signal transfer circuit according to an eighth embodiment.

FIG. 14 is a view given in explanation of a digital signal transfer circuit according to an eighth embodiment. The layout and beneficial effect of the digital signal transfer circuit according to the eighth embodiment are described below with reference to FIG. 14.

Layout and operation of this embodiment shown in FIG. 14 which are the same as in the case of the sixth embodiment shown in FIG. 11 are indicated by attaching the same reference symbols and detailed description is omitted.

In this embodiment, as shown in FIG. 14, both terminals of the secondary winding of the pulse transformer 26 are connected with the drain terminals of an FET 33 and FET 34. The source terminals of the FET 33 and FET 34 are mutually connected. The gate terminals of the FET 33 and FET 34 are connected with the output terminal of the input signal source 32 so that they are turned on or off in accordance with a digital signal generated from the input signal source 32.

Next, the operation of this embodiment will be described.

When the digital signal that is output from the input signal source 32 becomes high-level, the FET 33 and FET 34 assume an on condition. In response to this, the secondary winding of the pulse transformer 26 assumes a short-circuited condition. Consequently, as described in the sixth embodiment above, when the secondary winding of the pulse transformer 26 are short-circuited, the output signal Vout of the latch circuit 29 becomes high-level (see the closed condition of FIG. 12A and FIG. 12G).

Also, when the digital signal that is output from the input signal source 32 becomes low level, the FET 33 and FET 34 assume an off condition. In response to this, the secondary winding of the pulse transformer 26 assumes an open condition. Consequently, the output signal Vout of the latch circuit 29 becomes low level (see the open condition of FIG. 12A and FIG. 12G).

As described above, with this embodiment, in the same way as in the case of the seventh embodiment described above, the output signal Vout of the latch circuit 29 changes in response to the logic level of the digital signal that is output from the input signal source 32 and, as a result, isolating transfer of a digital signal can thus be achieved.

It should be noted that since the construction of this embodiment does not employ a rectifier for short-circuiting the secondary winding of the pulse transformer 26, a digital signal transfer circuit in which there is less likelihood of spurious operation then in the seventh embodiment described above can be implemented.

Ninth Embodiment

Figure 15:
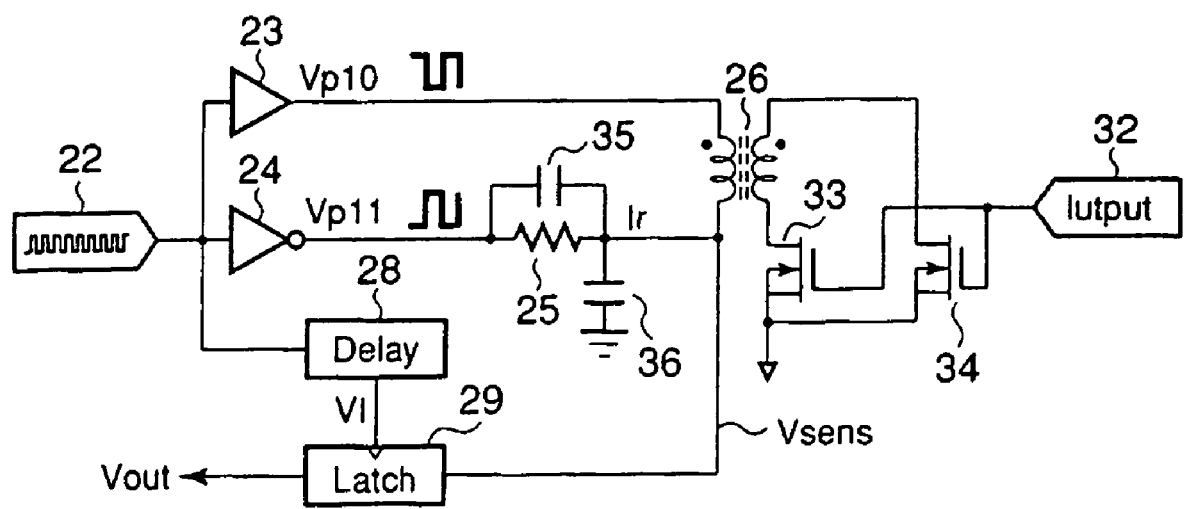
FIG. 15 is a view given in explanation of the layout of a digital signal transfer circuit according to a ninth embodiment.

FIG. 15 is a view given in explanation of a digital signal transfer circuit according to a ninth embodiment. The layout and beneficial effect of the digital signal transfer circuit according to the ninth embodiment are described below with reference to FIG. 15.

Layout and operation of this embodiment shown in FIG. 15 which are the same as in the case of the eighth embodiment shown in FIG. 14 are indicated by attaching the same reference symbols and detailed description is omitted.

In this embodiment, as shown in FIG. 15, a first capacitor 35 is connected to both terminals of a resistance 25 arranged on the primary side of the pulse transformer 26. Also, a second capacitor 36 is connected between the point of connection of the pulse transformer 26 and the resistance 25 and ground on the primary winding side of the pulse transformer 26. Filter means for removal of noise constituted by high-frequency current as described below is constituted by this resistance 25 and first and second capacitors 35 and 36.

Next, the operation of this embodiment will be described.

Since stray capacitance (parasitism capacity) is present between the primary winding and secondary winding of the pulse transformer 26, when for example potential fluctuations are generated between the primary winding and secondary winding, noise may flow into the primary winding through the stray capacitance. As a result, the waveform of the input voltage Vsens of the latch circuit 29 may be distorted, resulting in output of a spurious output signal Vout by the latch circuit 29.

The second capacitor 36 is employed to prevent spurious operation of the latch circuit 29 by allowing noise inflowing to the primary side of the pulse transformer 26 to flow to ground. However, if the capacitance of the second capacitor 36 is made too large, a sufficient input level of the latch circuit 29 may not achieved and normal digital signal transfer may no longer be achievable, owing to removal of the high-frequency components of the input signal Vsens of the latch circuit 29.

According, the first capacitor 35 is employed in order to guarantee a sufficient input level of the latch circuit 29 by lowering the high-frequency impedance between the converter 24 and the pulse transformer 26. Also, the first capacitor 35 has the action of lowering the impedance with respect to the noise component and the benefit of suppressing the spurious operation produced by noise as described above.

To summarize, with this embodiment, the use of a pulse transformer 26, which is of excellent operating characteristics in a high temperature environment compared with a photocoupler, makes it possible to realize a digital signal transfer circuit of high reliability and in which the probability of spurious operation due to noise is small.

It should be noted that the present invention is not restricted solely to the above embodiments but could be put into practice at the stage of practical implementation by modifying the structural elements thereof within a scope that does not depart from its gist. Various inventions may be constituted by suitable combination of a plurality of structural elements disclosed in the embodiments. For example, various structural elements may be deleted from the totality of structural elements disclosed in the embodiments. In addition, structural elements belonging to different embodiments may be suitably combined.

What is claimed is:

1. A digital signal transfer device comprising:
    a generating section that generates a square-wave carrier signal;
    a modulating section that generates a modulated signal by varying said carrier signal in accordance with a digital input signal;
    wherein said modulating section comprises:
        a first circuit comprising one of an AND gate circuit or an OR gate circuit, wherein a first input of the first circuit is said digital input signal, and wherein a second input of the first circuit is said carrier signal;
        an inverter circuit configured to output an inverted signal of said carrier signal; and
        a second circuit comprising one of an AND gate circuit or an OR gate circuit, wherein a first input of the second circuit is said digital input signal, and wherein a second input of the second circuit is an inverted signal of said carrier signal,
    a demodulating section that generates an output signal in which a waveform of said digital input signal is restored from said modulated signal wherein the demodulating section belongs to a power source system different from said modulating section, wherein the demodulation section comprises a switch section configured to turn on or off in accordance with the modulated signal, and wherein the demodulating section is configured to restore a waveform of the digital input signal in response to operation of the switch section; and
    an isolating transfer section that connects said modulating section and said demodulating section in an electrically isolated condition and that transfers said modulated signal from said modulating section to said demodulating section, wherein the isolating transfer section comprises a pulse transformer.

2. The digital signal transfer device according to claim 1, wherein output terminals of said first and second circuits are connected with a primary winding of said pulse transformer; and wherein the switch section is further configured to turn on or off in response to a signal induced in a secondary winding of said pulse transformer, and wherein the demodulating section further comprises:

a capacitor whose two terminals are short-circuited or opened in response to "on" or "off" of said switch section;

a power source for charging charge onto said capacitor; and a current limiting section for suppressing a rate of rise of a voltage of said capacitor;

wherein the demodulating section is further configured to restore the waveform of said digital input signal in response to charging/discharging of said capacitor.

3. The digital signal transfer device according to claim 1, wherein the first circuit comprises a first OR gate circuit, wherein the second circuit comprises a second OR gate circuit.

4. The digital signal transfer device according to claim 1, wherein said modulating section further comprises:

an exclusive OR gate circuit; and a buffer circuit that inputs said carrier signal;

wherein output terminals of said exclusive OR gate circuit and said buffer circuit are connected with a primary winding of said pulse transformer; and wherein the switch section is further configured to turn on or off in response to a signal induced in said secondary winding of said pulse transformer; and wherein the demodulating section further comprises:

a capacitor whose two terminals are short-circuited or opened in response to "on" or "off" of said switch section;

a power source for charging charge onto said capacitor; and a current limiting section for suppressing a rate of rise of a voltage of said capacitor;

wherein the demodulating section is further configured to restore a waveform of said digital input signal in response to charging/discharging of said capacitor.

5. A digital signal transfer device, comprising:

a generating section configured to generate a square-wave carrier signal;

a modulating section configured to generate a modulated signal by varying the carrier signal in accordance with a digital input signal;

a demodulating section configured to generate an output signal in which a waveform of the digital input signal is restored from the modulated signal; and an isolating transfer section configured to couple the modulating section and the demodulating section in an electrically isolated condition and to transfer the modulated signal from the modulating section to the demodulating section;

wherein said modulating section comprises:

a first NAND gate circuit whose first input is the digital input signal and whose second input is the carrier signal;

an inverter circuit configured to output an inverted signal of the carrier signal; and a second NAND gate circuit whose first input is the digital input signal and whose second input is an inverted signal of the carrier signal.

6. A digital signal transfer device, comprising:

a generating section configured to generate a square-wave carrier signal;

a modulating section configured to generate a modulated signal by varying the carrier signal in accordance with a digital input signal;

a demodulating section configured to generate an output signal in which a waveform of the digital input signal is restored from the modulated signal; and an isolating transfer section configured to couple the modulating section and the demodulating section in an electrically isolated condition and to transfer the modulated signal from the modulating section to the demodulating section;

wherein the modulating section comprises:

a first NOR gate circuit whose first input is the digital input signal and whose second input is the carrier signal;

an inverter circuit configured to output an inverted signal of the carrier signal; and a second NOR gate circuit whose first input is the digital input signal and whose second input is an inverted signal of the carrier signal.

* * * * *